(12) United States Patent
Jeong

(10) Patent No.: US 6,921,952 B2
(45) Date of Patent: Jul. 26, 2005

(54) TORSION SPRING FOR MEMS STRUCTURE

(75) Inventor: Hee-moon Jeong, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 73 days.

(21) Appl. No.: 10/358,360

(22) Filed: Feb. 5, 2003

(65) Prior Publication Data

US 2003/0227114 A1 Dec. 11, 2003

(30) Foreign Application Priority Data

Feb. 7, 2002 (KR) .................................. 10-2002-0007052

(51) Int. Cl.[7] .............................................. H01L 29/84
(52) U.S. Cl. ...................... 257/417; 257/415; 257/482; 257/682; 257/680
(58) Field of Search ................................ 257/417, 415, 257/482, 682, 680

(56) References Cited

U.S. PATENT DOCUMENTS 5,862,003 A * 1/1999 Saif et al. ................... 359/871
6,541,831 B2 * 4/2003 Lee et al. ................... 257/415
6,668,628 B2 * 12/2003 Hantschel et al. ............ 73/105

OTHER PUBLICATIONS

Muller, "Microgimbal Torsion Beam Design Using Open, Thin–Walled . . . " J.MEMS, 10(4):550–560, Dec. 2001.

* cited by examiner

Primary Examiner—David Zarneke
Assistant Examiner—Igwe U. Anya
(74) Attorney, Agent, or Firm—Lee & Morse, P.C.

(57) ABSTRACT

A torsion spring for a MEMS structure has a plurality of beams, each beam having two ends wherein both ends are fixed to a predetermined area, and at least one connection bar disposed at a right angle to a lengthwise direction of the plurality of beams, wherein the at least one connection bar connects the plurality of beams. Preferably, the distance between the connection bars is equal to or greater than the width of one of the plurality of beams. Accordingly, a torsion spring according to the present invention has a bending stiffness greater than a torsional stiffness, which allows easier torsion. Further, a torsion spring according to the present invention may be easily fabricated by etching.

10 Claims, 6 Drawing Sheets

TORSION SPRING FOR MEMS STRUCTURE

BACKGROUND OF THE INVENTION

1. Field of the Invention

The present invention relates to a torsion spring for a micro electro mechanical system (MEMS) structure. More particularly, the present invention relates to a torsion spring having a greater bending stiffness than a torsional stiffness.

2. Description of the Prior Art

Micro electro mechanical system (MEMS) technology is used in the manufacture of mechanical and electric elements through semiconductor processes. MEMS technology usually includes a structure mounted on a substrate and other parts, such as a spring, to support the structure and allow the structure to move in a predetermined direction. For example, to manufacture a MEMS gyroscope, there should be a mass mounted on a substrate and a torsion spring formed on the substrate in order to support the mass, which is to be rotated around a particular axis.

In the above MEMS structure, the torsion spring should allow the structure to be rotated in a certain rotational direction and limit the rotation of the structure in other directions. For the torsion spring to operate effectively, the torsion spring should have a high bending stiffness, i.e., the stiffness of torsion in a direction perpendicular to an axis of torsion, and a low torsional stiffness, i.e., the stiffness of torsion in a direction parallel to the axis of torsion.

A torsion spring used in a macro structure should have a circular section or a cross-shaped section so that a bending stiffness is greater than a torsional stiffness. However, in a MEMS structure, the manufacturing process may be very complex or require several additional processes to manufacture a torsion spring having a circular section or a cross-shaped section as described above.

A conventional torsion spring for a MEMS structure is fabricated as a beam with a quadrilateral section, as shown in FIG. 1. In the torsion spring 10 of FIG. 1, the bending stiffness and the torsional stiffness are determined based on a ratio of the width, length, and height of the beam. For example, as the length of the beam increases, both the bending stiffness and the torsional stiffness become weaker. Therefore, it is difficult to manufacture a torsion spring, constructed as shown in FIG. 1, having a high bending stiffness to torsional stiffness ratio.

To solve the above problem, a conventional torsion spring 20, as shown in FIGS. 2A and 2B, has been proposed. The conventional torsion spring 20 includes a connection plate 23 to connect upper parts of a pair of beams 21, the connection plate 23 being disposed perpendicular to the pair of beams 21 and extending the length of the beams 21. Thus, in the above structure, the bending stiffness may be increased without significantly increasing the torsional stiffness. The torsion spring 20 of FIGS. 2A and 2B, however, has a disadvantage in that it requires several additional processing steps. Moreover, the torsion spring 20 cannot be fabricated by a single etching process.

SUMMARY OF THE INVENTION

Accordingly, it is a feature of an embodiment of the present invention to provide a torsion spring for a MEMS structure having a bending stiffness that is greater than a torsional stiffness thereof, and which facilitates a simplified fabrication process.

In order to provide the above feature, a torsion spring for a MEMS structure according to an embodiment of the present invention includes a plurality of beams, each beam having two ends wherein both ends are fixed to a predetermined area; and at least one connection bar disposed at a right angle to a lengthwise direction of the plurality of beams, wherein the at least one connection bar connects the plurality of beams.

Preferably, the plurality of beams are parallel. Also preferably, the pair of beams is a pair of beams. The pair of beams are preferably connected by a plurality of connection bars disposed at equal intervals.

In one embodiment of the present invention, a connection area formed between the pair of beams and the plurality of connection bars is round.

Preferably, a distance between the plurality of connection bars is equal to, or greater than a width of one of the plurality of beams. By controlling the distance, a ratio of bending stiffness to torsional stiffness may become greater. A torsion spring according to the present invention is able to have a bending stiffness that is greater than a torsional stiffness, which allows easier torsion. Additionally, the torsion spring may be easily fabricated by a single etching process.

BRIEF DESCRIPTION OF THE DRAWINGS

The above and other features and advantages of the present invention will become readily apparent to those of ordinary skill in the art by the following detailed description of preferred embodiments thereof with reference to the attached drawings in which.

DETAILED DESCRIPTION OF THE INVENTION

Korean Patent Application No. 2002-07052, filed Feb. 7, 2002, and entitled: "Torsion Spring for MEMS Structure," is incorporated by reference herein in its entirety.

The present invention will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the concept of the invention to those skilled in the art. Like numbers refer to like elements throughout.

Figure 3:
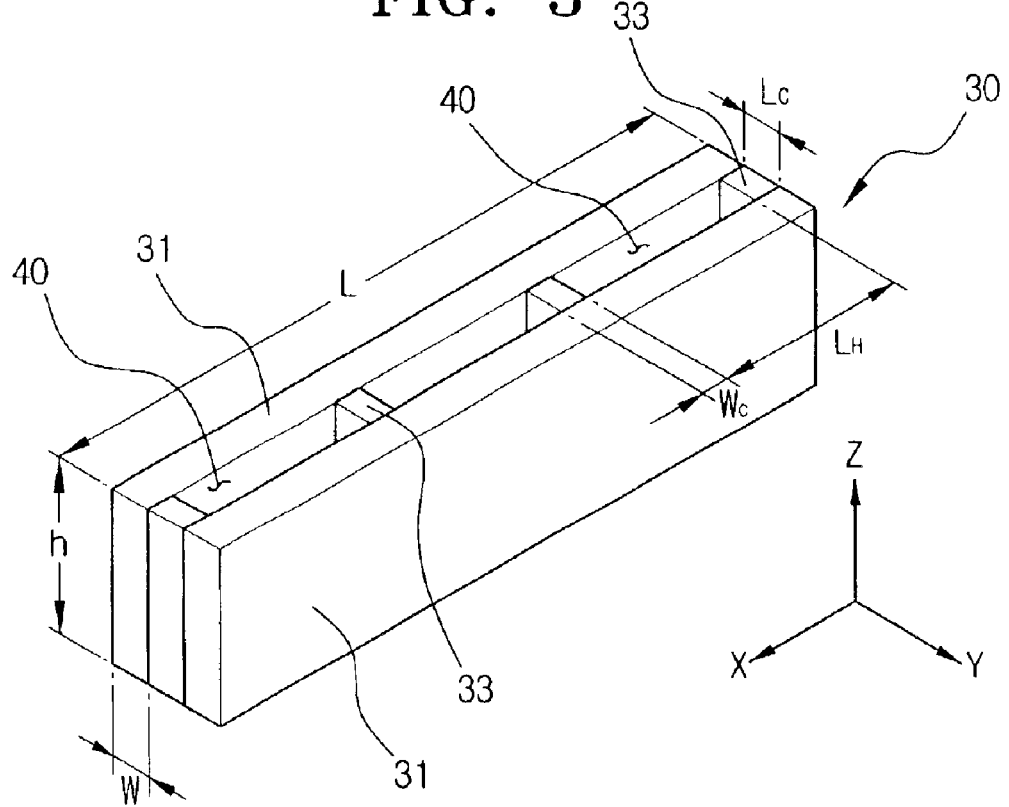
FIG. 3 illustrates a perspective view of a preferred embodiment of a torsion spring for a MEMS structure according to the present invention.

FIG. 3 illustrates a perspective view of a torsion spring for a MEMS structure according to an embodiment of the present invention. The torsion spring 30 according to the present invention includes a pair of beams 31 and four connection bars 33 to connect the beams 31. A torsion spring according to an embodiment of the present invention may be manufactured using a single crystal silicon, poly-crystal silicon, silicon nitride, or silicon dioxide (i.e., glass).

The beams 31 are disposed in an axial direction of torsion, in other words, in the direction of the x-axis. Each beam 31 is a plate having two ends and a quadrilateral section. The beams 31 are disposed parallel, and both ends of the beams 31 are fixed to a predetermined area, such as an anchor or a mass on a substrate (not shown).

The connection bars 33 are plates disposed at a right angle to the lengthwise direction, i.e., the direction of the x-axis, of the beams 31. In other words, the connection bars 33 are plates having a normal line corresponding to the x-axis. The connection bars 33 are disposed between the beams 31 at equal intervals. When the connection bars 33 are disposed as described above, the torsion spring 30 has three holes 40 penetrating in a vertical direction (the direction of the z-axis).

It is preferable that the distance between each of the connection bars 33 is equal to or greater than the width of the beams 31. By controlling the distance, the ratio of bending stiffness to torsional stiffness may increase. Moreover, it is preferable that a width of each of the beams 31 is between about 1 $\mu$m to 25 $\mu$m.

In a preferred embodiment of the present invention, the torsion spring has one pair of beams 31 and four connection bars 33, however, the number of beams 31, the number of connection bars 33, and the interval between the connection bars 33 may be changed. For example, three or more beams may be disposed parallel, or the number of the connection bars may be one, two, or more. The interval between the connection bars may also be equal or varied.

Figure 1:
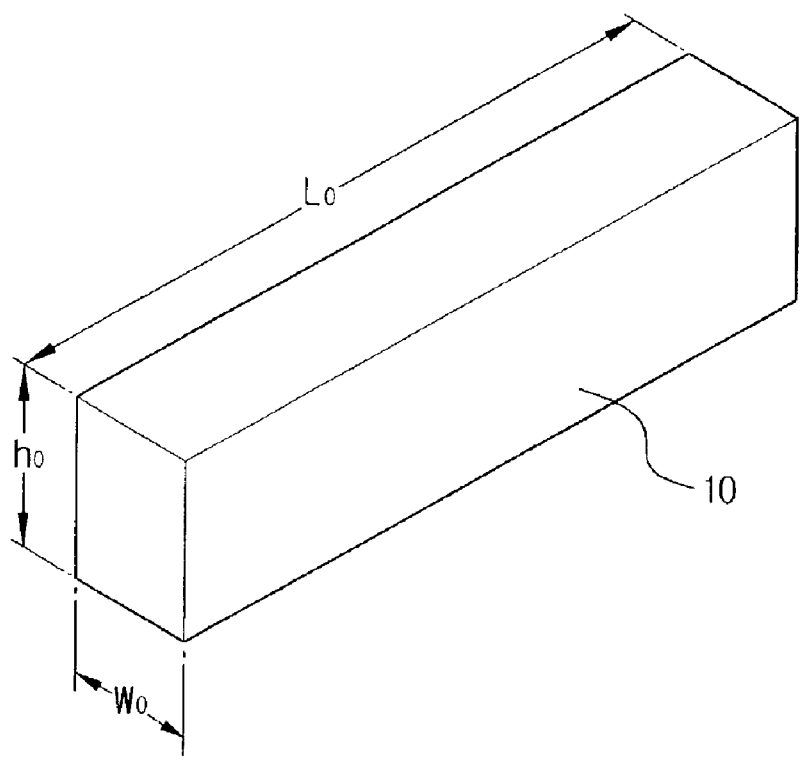
FIG. 1 illustrates a perspective view of a conventional torsion spring for a MEMS structure.
Figure 4:
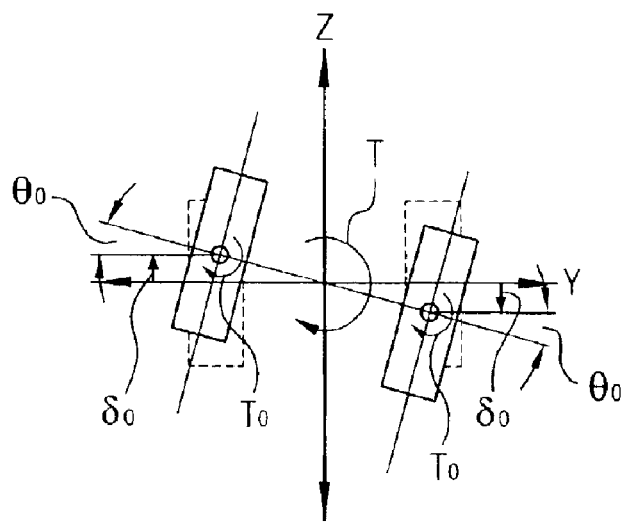
FIG. 4 illustrates a view of a torsion status diagram in a direction of the x-axis of the torsion spring of FIG. 3.

The conventional torsion spring 10 of FIG. 1 includes a single beam with a quadrilateral section. In the torsion spring 30 according to an embodiment of the present invention, however, more than two beams 31 are connected through the connection bars 33. Therefore, as shown in FIG. 4, when a torsional moment (T) is applied to the torsion spring 30 according to an embodiment of the present invention, each beam 31 has a displacement ($\delta_0$) in the z-direction and a rotational angle ($\theta_0$) in the x-direction due to a bending moment for the y-axis and a torsional moment ($T_o$) for the x-axis, respectively, which are generated to satisfy the compatibility condition between the beams 31.

Figure 6A:
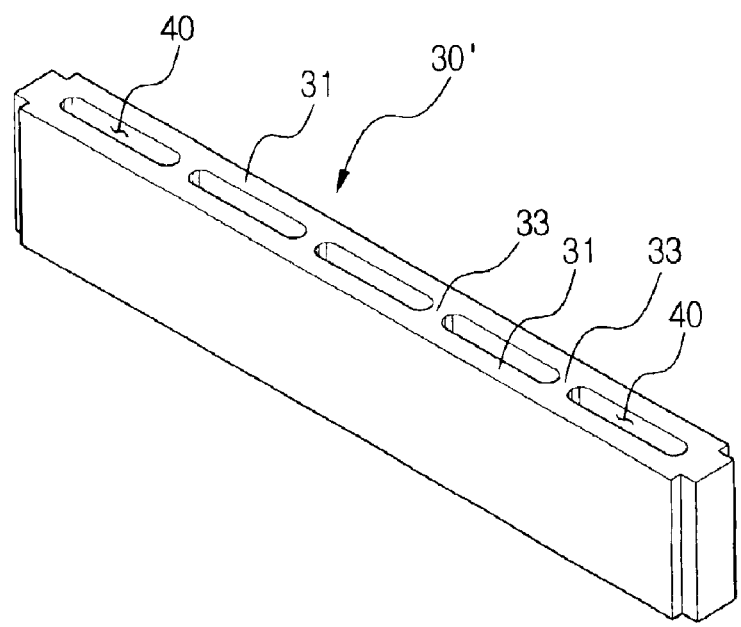
FIGS. 6A and 6B illustrate a perspective view and a top view, respectively, of another preferred embodiment of the torsion spring for a MEMS structure according to the present invention.
Figure 6B:
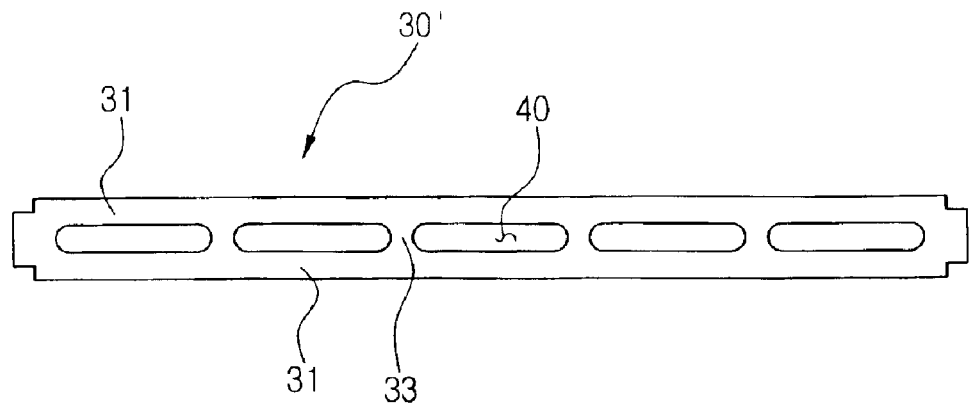

FIGS. 6A and 6B show another preferred embodiment of the present invention. Referring to FIGS. 6A and 6B, torsion spring 30' has six connection bars 33 so that five holes 40 are formed. In FIGS. 6A and 6B, the same reference numerals have been given to substantially the same parts as FIGS. 3 and 4 for more convenient description.

When the torsion spring 30' is formed to have five holes 40, as shown in FIGS. 6A and 6B, i.e., when one pair of beams 31 is connected using six connection bars 33, the preferable numerical values are as follows. A width (w) of each beam 31 is 5 $\mu$m, a height (h) of each beam 31 is 40 $\mu$m, and a length (L) of each beam 31 is 200 $\mu$m. Moreover, a width ($w_c$) of each connection bar 33 is 5 $\mu$m, a length ($L_c$) of each connection bar 33 is 5 $\mu$m, and a height ($h_c$) of each connection bar 33 is 40 $\mu$m, which is the same as the height (h) of the beam 31. In addition, a width ($W_H$) of each hole 40 is 5 $\mu$m, which is the same as the length ($L_c$) of the connection bars 33. A length ($L_H$) of each hole is 34 $\mu$m.

The torsional stiffness of a torsion spring 30 having the above dimensions may be obtained using a finite element method. Furthermore, the torsional stiffness of the conventional torsion spring 10 is obtained by supposing the width of the conventional torsion spring 10 is the same as the sum of the width of two beams 31 according to the present invention, which is 10 $\mu$m. Then, the length of the conventional torsion spring 10 to allow the conventional torsion spring 10 to have the same torsional stiffness as the torsion spring 30 of the present invention may be obtained.

Moreover, bending stiffness $K_{BYO}$ for the y-axis, i.e., the direction of the width of the conventional torsion spring 10, and bending stiffness $K_{BZO}$ for the z-axis, i.e., the direction of the height of the conventional torsion spring 10, are respectively obtained. After that, bending stiffness $K_{BY}$ for the y-axis, i.e., the direction of the width of the torsion spring 30 according to the present invention, and bending stiffness $K_{BZ}$ for the z-axis, i.e., the direction of the height of the torsion spring 30 according to the present invention, are respectively obtained.

Figure 5:
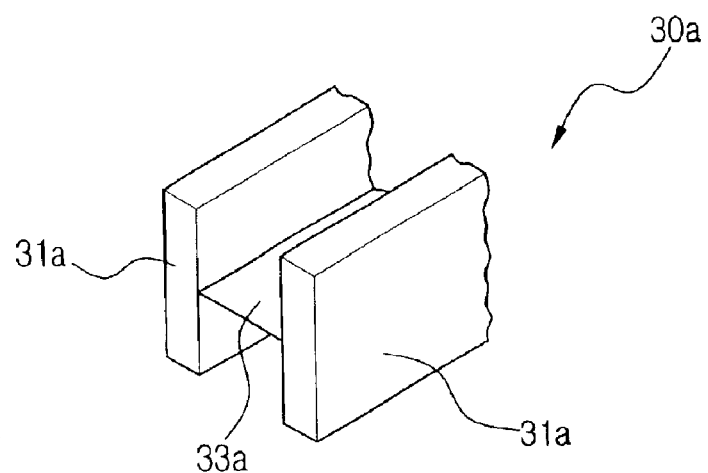
FIG. 5 illustrates a view schematically showing a conceptual portion of a torsion spring used for calculating stiffness of the torsion spring of FIG. 3.

Bending stiffness $K_{BZ}$ for the z-axis is obtained by the following mathematical expression 1 as in the conventional torsion spring 10:

$$K_{BZ} = \frac{E2wh^3}{L^3} \qquad \text{[Mathematical Expression 1]}$$

and bending stiffness $K_{BY}$ for the y-axis is obtained by using the conceptual torsion spring 30a of the present invention, as shown in FIG. 5. In other words, when it is conceptualized that two beams 31a forming the torsion spring 30a are connected with an imaginary plate 33a, bending stiffness $K_{BY}$ for the y-axis is obtained by the following mathematical expression 2, and the bending stiffness $K_{BY}$ increases as a moment of inertia increases. Mathematical expression 2 is:

$$K_{BY} = \frac{Ewh}{L^3}(h^2 + 6c^2) \qquad \text{[Mathematical Expression 2]}$$

Torsional stiffness $K_T$ is obtained by the following mathematical expression 3:

$$K_T = \frac{G_k w^3 h}{L} + \frac{E_c^2 wh^3}{2L^3} \qquad \text{[Mathematical Expression 3]}$$

wherein k is a torsion constant according to sectional ratio, c=w+$L_C$, E is an elastic modulus, and G is a shear modulus.

However, bending stiffness $K_{BY}$ for the torsion in the direction of the y-axis is difficult to calculate, which is the measurement conceptualized in FIG. 5, even though the two beams 31 are connected. In addition, to get the most suitable and accurate measurement, an appropriate structure is determined by comparing the stiffness in accordance with the number of the connection bars 33 through finite element analysis.

Figure 7:
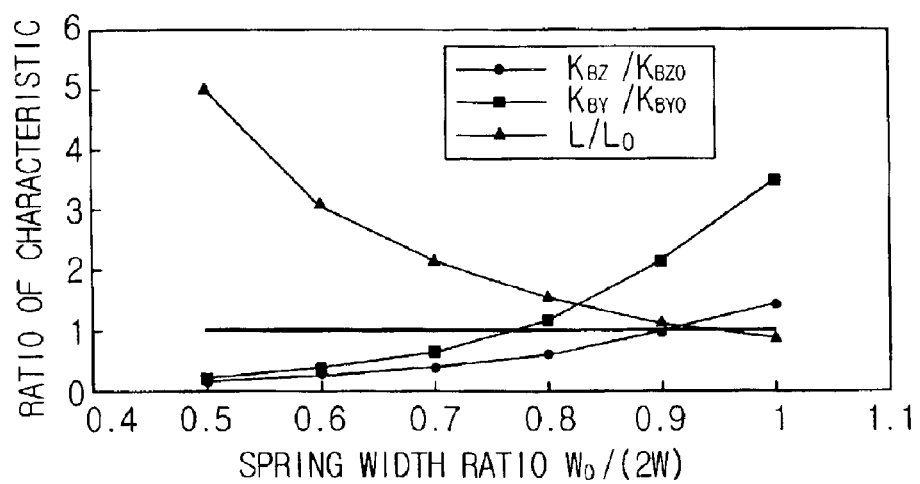
FIG. 7 is a graph of regulated characteristics of the torsion spring according to the present invention as compared to a conventional torsion spring.

FIG. 7 is a graph showing the ratio of each value of characteristics L, $K_{BY}$, and $K_{BZ}$ obtained by the torsion spring 30 according to an embodiment of the present invention and $L_O$, $K_{BYO}$, and $K_{BZO}$ of the conventional torsion spring 10 determined when the width of the torsion spring 10 is gradually reduced from 10 $\mu$m to 5 $\mu$m.

As shown in FIG. 7, when the sum of the width (w) of each beam 31 of the torsion spring 30 of the present invention is the same as the width ($w_O$) of the conventional torsion spring 10, in other words, when $w_O/2w=1$, bending stiffness in the direction of the y-axis of the torsion spring 30 of the present invention is 3.4 times that of the conventional torsion spring 10 (in other words, $K_{BY}/K_{BYO}=3.4$), and bending stiffness in the direction the z-axis of the torsion spring 30 of the present invention is 1.5 times that of the conventional torsion spring 10 (in other words, $K_{BZ}/K_{BZO}=1.5$). Additionally, at $w_O/2w=1$, the ratio of the length (L) of the torsion spring 30 to the length ($L_O$) of the conventional spring 10 is 0.86. Accordingly, the bending stiffness $K_{BY}$ and $K_{BZ}$ to the torsional stiffness $K_T$ decreases as compared to the conventional torsion spring 10, even though the torsion spring 30 of the present invention is fabricated having a shorter length as compared to the conventional spring 10.

Furthermore, when $w_O/2w \geqq 0.78$, the bending stiffness for the y-axis of the torsion spring 30 of the present invention is greater than the bending stiffness of the conventional torsion spring 10. Similarly, when $w_O/2w \geqq 0.9$, the bending stiffness for the y-axis and the bending stiffness for the z-axis of the present invention are both greater than the corresponding bending rigidities of the conventional torsion spring 10.

In the meantime, when $w_O/2w=0.5$, i.e., when the width ($w_O$) of the conventional torsion spring 10 and the width (w) of one of the beams 31 of the torsion spring 30 of the present invention are equal, the bending stiffness of the conventional torsion spring 10 is greater than that of the torsion spring 30 of an embodiment of the present invention. In this case, the length ($L_O$) of the conventional torsion spring 10 becomes much shorter than the length (L) of the torsion spring 30 of an embodiment of the present invention ($L/L_O=5$). Therefore, the structure of the conventional torsion spring 10 is very unstable due to the short length and the narrow width. Moreover, the ability to manufacture such a conventional torsion spring 10 is limited.

Figure 8:
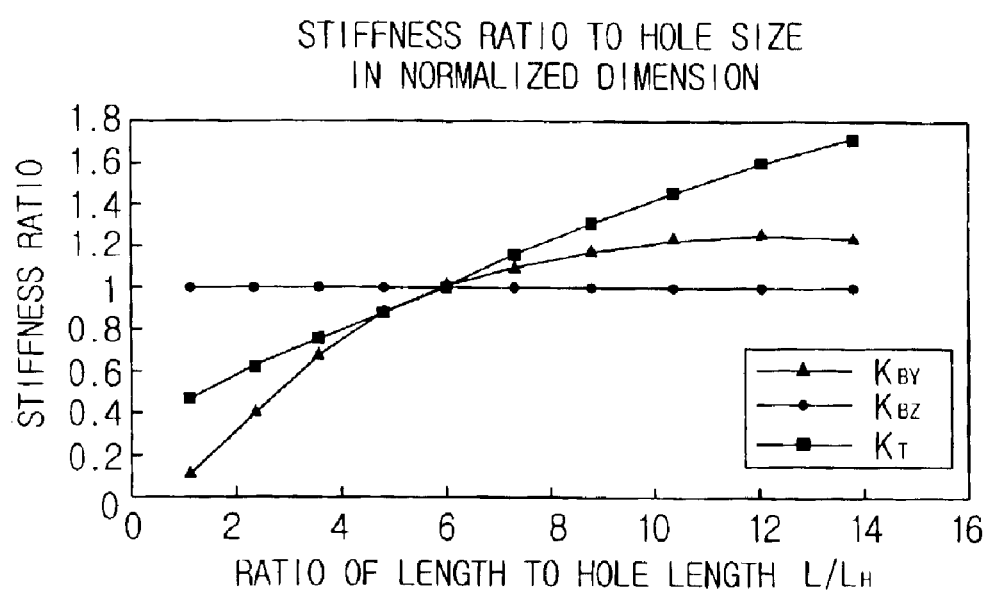
FIG. 8 is a graph of a regulated stiffness ratio of the torsion spring to the size of a hole according to the present invention.

FIG. 8 is a graph showing the ratio of the stiffness varying in accordance with the change of the number of holes 40 from one to ten based on the case that the torsion spring 30' of the present invention is formed to have five holes 40 (the length of the hole 40 $L_H=34$ μm) as described above. The horizontal axis is the ratio of the length (L) of the torsion spring 30 to the length ($L_H$) of the hole 40. The basic value is 200 μm/34 μm=5.88. As the number of holes 40 increases, the stiffness ratio increases from the order of the bending stiffness ($K_{BZ}$) in the direction of the z-axis. Similarly, the bending stiffness ($K_{BY}$) in the direction of the y-axis and the torsional stiffness ($K_T$) increase. However, there is little change in bending stiffness ($K_{BZ}$) in the direction of the z-axis.

Preferably, as shown in FIGS. 6A and 6B, the connection areas of the beams 31 and the connection bars 33 are formed to be round. When the connection areas of the beams 31 and the connection bars 33 are formed to be angular, as in FIG. 3, there may be a crack generated or a concentration of stress, thus rounded holes may prevent generation of a crack or the concentration of stress.

As shown in FIGS. 7 and 8, as a preferable design example of the torsion spring 30 of the present invention, when the ratio of the length (L) of the torsion spring 30 to the length ($L_H$) of the hole 40 is 5.71 and the sum of the width (2w) of the torsion spring 30 of the present invention is the same as the width ($w_O$) of the conventional torsion spring 10, the bending stiffness of the torsion spring 30 of the present invention, which has the same torsional stiffness as the conventional torsion spring 10, increased 3.4 and 1.5 times for the y-axis and z-axis, respectively. Furthermore, when the ratio of the width ($w_O$) of the conventional spring 10 to the sum (2w) of the width of the torsion spring 30 of the present invention is 0.78, the bending stiffness for the torsion of the y-axis is greater than that of the conventional torsion spring 10. When the ratio of the width ($w_O$) of the conventional spring 10 to the sum (2w) of the width of the torsion spring 30 of the present invention is 0.9, the bending stiffness for the torsion of the z-axis also is greater as compared to that of the conventional torsion spring 10.

Accordingly, while maintaining the same torsional stiffness as a conventional angular torsion spring 10, a torsion spring 30 of an embodiment of the present invention has a high stiffness in an unwanted direction. Moreover, structurally generated stress may be reduced.

Figure 2A:
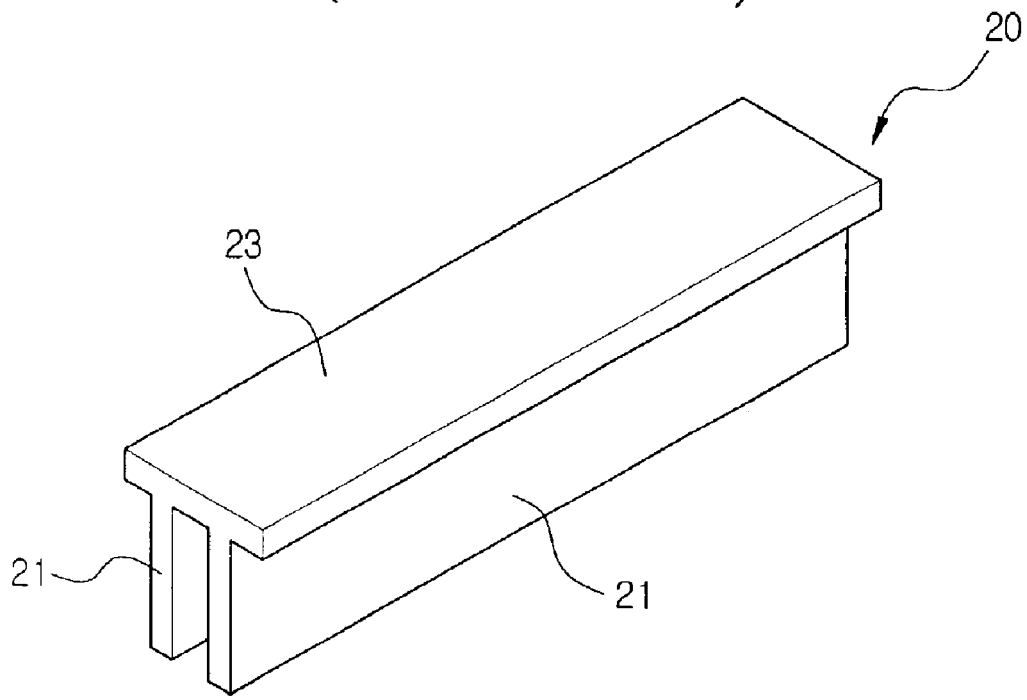
FIGS. 2A and 2B illustrate a perspective view and a side view, respectively, of another conventional torsion spring for a MEMS structure.
Figure 2B:
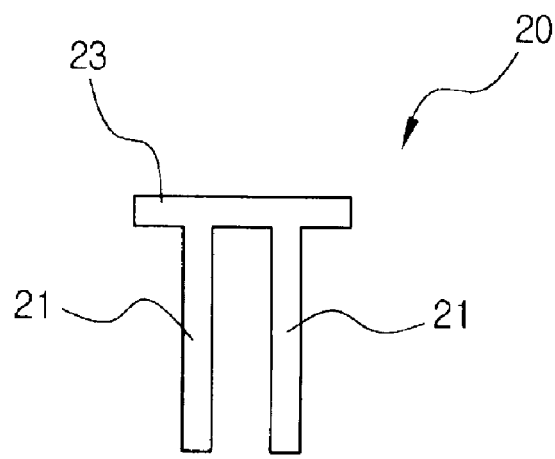

As shown in FIG. 2A, the conventional torsion spring 20 requires a more complex fabrication processes, whereas the torsion spring 30 according to an embodiment of the present invention may be fabricated with a single etching process, wherein the etching forms a block having vertical holes formed therein.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A torsion spring for a MEMS structure, comprising:
    a plurality of beams, each beam having two ends wherein both ends are fixed to a predetermined area; and
    at least one connection bar disposed at a right angle to a lengthwise direction of the plurality of beams, wherein the at least one connection bar is a plurality of connection bars disposed at equal intervals and connects the plurality of beams wherein a distance between the plurality of connection bars is equal to or greater than a width of one of the plurality of beams.

2. The torsion spring for a MEMS structure as claimed in claim 1, wherein the plurality of beams are parallel.

3. The torsion spring for a MEMS structure as claimed in claim 1, wherein the plurality of beams is a pair of beams.

4. The torsion spring for a MEMS structure as claimed in claim 3, wherein the pair of beams are connected by a plurality of connection bars.

5. The torsion spring for a MEMS structure as claimed in claim 4, wherein a connection area formed between the pair of beams and the plurality of connection bars is round.

6. The torsion spring for a MEMS structure as claimed in claim 1, wherein the width of each one the plurality of beams is between about 1 μm and 25 μm.

7. The torsion spring for a MEMS structure as claimed in claim 1, wherein a length of one of the plurality of beams is equal to or greater than 5.71 times the distance between the plurality of bars.

8. A torsion spring for a MEMS structure as, comprising:
    a plurality of beams, each beam having two ends wherein both ends are fixed to a predetermined area; and
    at least one connection bar disposed at a right angle to a lengthwise direction of the plurality of beams, wherein the at least one connection bar is a plurality of connection bars disposed at equal intervals and a distance between at least two of the plurality of connection bars is equal to or greater than a width of one of the plurality of beams.

9. The torsion spring for a MEMS structure as claimed in claim 8, wherein the width of one of the plurality of beams is between about 1 μm and 25 μm.

10. A torsion spring for a MEMS structure as, comprising:

a plurality of beams, each beam having two ends wherein both ends are fixed to a predetermined area; and at least one connection bar disposed at a right angle to a lengthwise direction of the plurality of beams, wherein the at least one connection bar is a plurality of connection bars disposed at equal intervals and two connection bars of the plurality of connection bars are each disposed at one of the two ends of the plurality of beams.

* * * * *